United States Patent [19]

Evans

[11] 4,057,311
[45] Nov. 8, 1977

[54] ELASTOMERIC CONNECTOR FOR PARALLEL CIRCUIT BOARDS

[75] Inventor: William Robert Evans, Clemmons, N.C.

[73] Assignee: AMP Incorporated, Harrisburg, Pa.

[21] Appl. No.: 740,981

[22] Filed: Nov. 11, 1976

[51] Int. Cl.² .............................................. H05K 1/12
[52] U.S. Cl. ................................ 339/17 M; 339/61 M
[58] Field of Search ............. 339/17 F, 17 LM, 17 M, 339/17 C, 59 R, 59 M, 61 R, 61 M, 176 MF

[56] References Cited

U.S. PATENT DOCUMENTS

| 3,319,216 | 5/1967 | McCullough | 339/59 M |
| 3,924,915 | 12/1975 | Conrad | 339/17 F |

Primary Examiner—Roy Lake
Assistant Examiner—Neil Abrams
Attorney, Agent, or Firm—Frederick W. Raring; Robert W. Pitts; Jay L. Seitchik

[57] ABSTRACT

Electrical connector for connecting opposed conductors on spaced-apart printed circuit boards or the like comprises a connector housing body having oppositely directed sides which have trough-like recesses therein. Elastomeric bodies are provided in the recesses and have surface portions which normally project beyond the oppositely directed sides. A flexible circuit having closely spaced parallel conductors thereon is held on the elastomeric bodies and extends over the projecting portions of these bodies and across a side of the housing body which is between the opposed oppositely directed sides. In use, the connector is clamped between opposed surfaces of the printed circuit boards with the conductors on the flexible circuit in engagement with conductors on the printed circuit boards. The elastomeric bodies are held in a compressed condition and provide the contact force which urges the conductors on the flexible circuit against the conductors on the printed circuit boards thereby to form electrical paths extending between corresponding conductors on the printed circuit boards.

5 Claims, 4 Drawing Figures

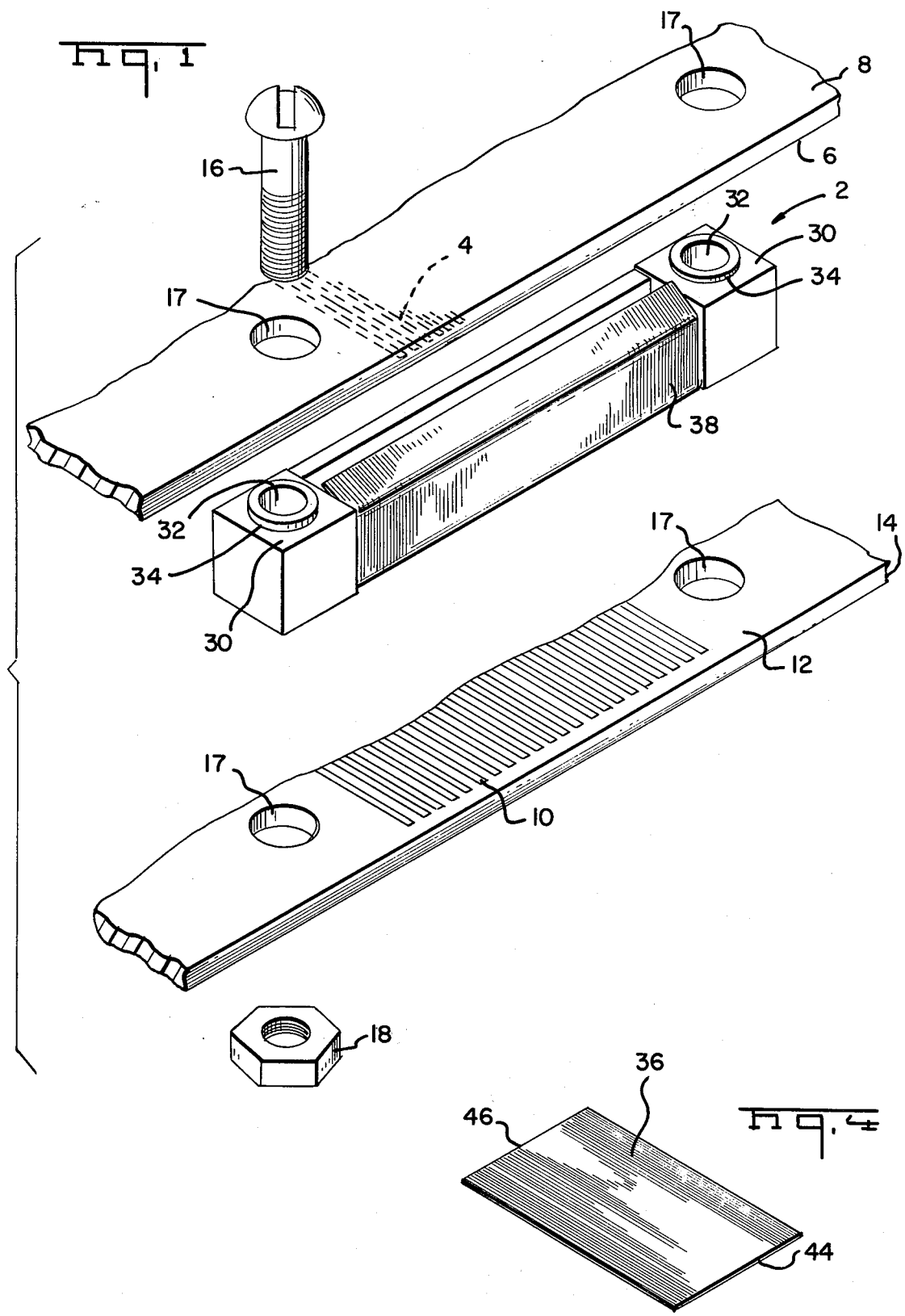

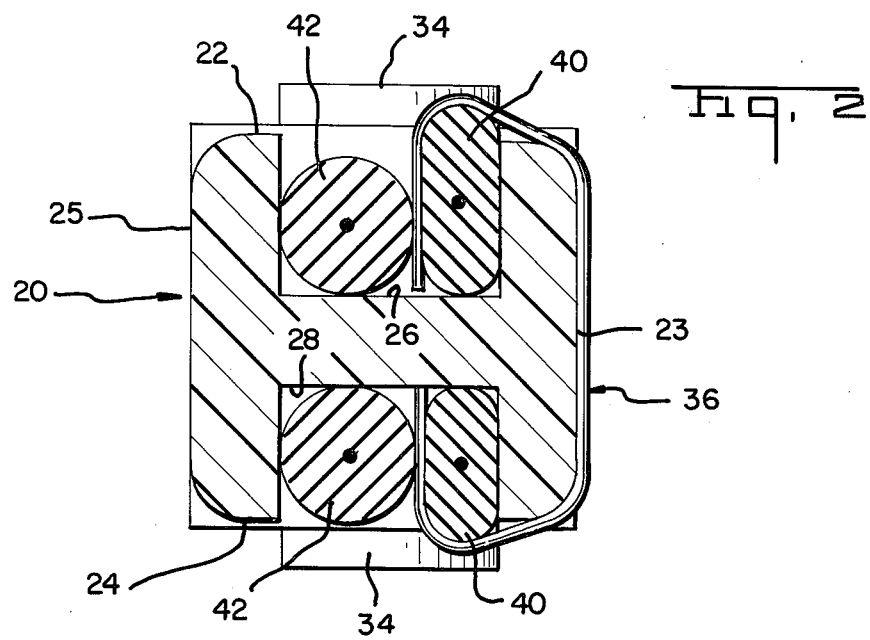
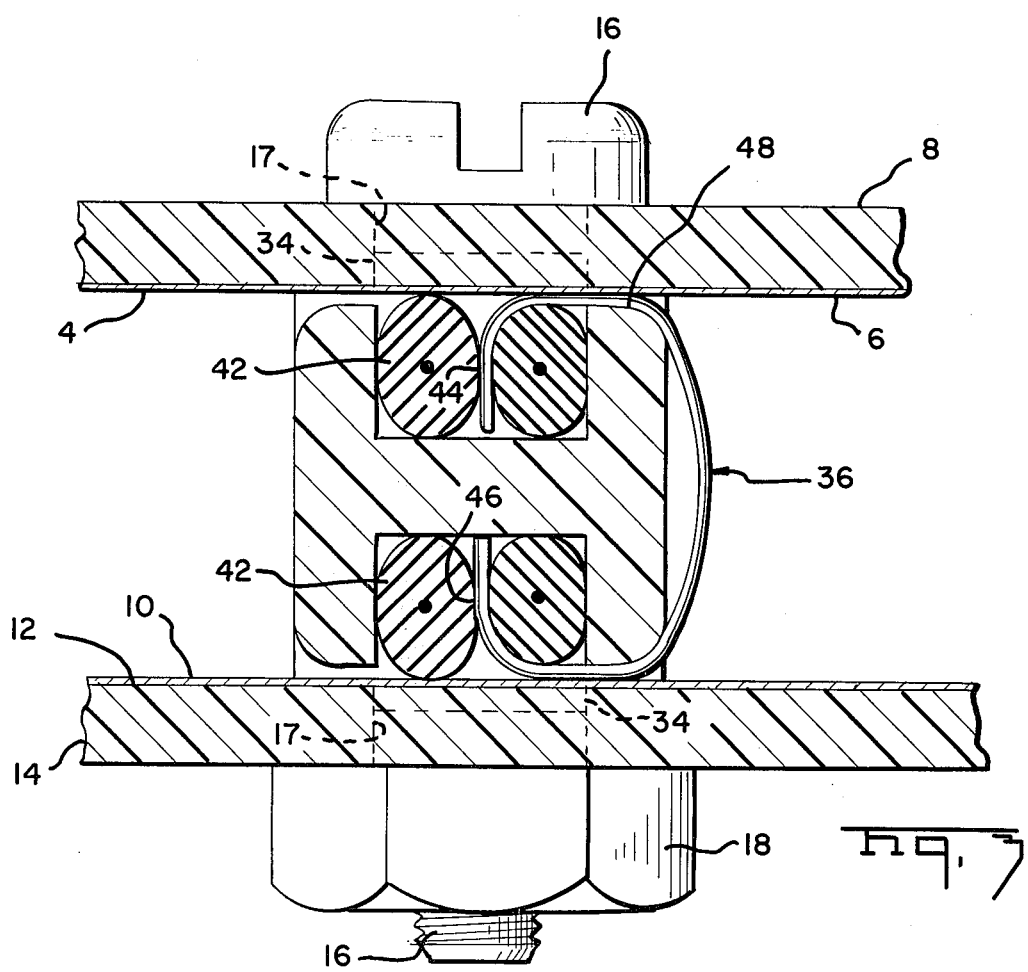

ELASTOMERIC CONNECTOR FOR PARALLEL CIRCUIT BOARDS

BACKGROUND OF THE INVENTION

This invention relates to electrical connectors for connecting conductors on the opposed surfaces of two panel-like members such as printed circuit boards. The herein disclosed embodiment of the invention contains elastomeric connecting devices of the type disclosed and claimed in my prior U.S. Pat. No. 3,985,413.

A common requirement in the field of electronic packaging is for a connector to connect opposed conductors on the opposed surfaces of two panel-like members such as printed circuit boards or ceramic substrates. A variety of connectors are available in many different sizes and shapes for specific conditions which are encountered in electronic packaging. The dimensional requirements for such connectors varies widely, some connectors being required for connecting conductors on printed circuit boards which are spaced-apart by only about 0.2 inches or less although the spacing between the printed circuit boards may be an inch or more. It can be appreciated that connectors must be made available in a wide range of sizes to accommodate these vast differences in packaging dimensions.

U.S. Pat. No. 3,985,413 discloses and claims an electrical connector comprising a generally cylindrical elastomeric body having a flexible circuit wrapped therearound which has parallel spaced-apart conductors on its surface. In use, a connector of this type can be simply placed between the panel-like members so that when the members are secured in parallel spaced-apart relationship, the elastomeric body will be compressed and the conductors will be urged against the conductors on the panel-like members to form the required electrical paths between the conductors on the two panel-like members. Connectors of this type are receiving widespread acceptance in the packaging industry and there is a need for connectors of this general type in a relatively wide range of sizes to accommodate varying distances between the panel-like members.

Connectors of different sizes for varying spacings between the printed circuit boards can be produced by simply manufacturing the cylindrical elastomeric bodies in a range of sizes, and to some extent, this solution has been followed. However, if a connector of the type shown in U.S. Pat. No. 3,985,413 is produced in a relatively large size, say having a diameter of about an inch, for use under circumstances where the printed circuit boards are spaced-apart by a slightly lesser distance, the connector becomes somewhat massive and it would be desirable to reduce its width, that is, its dimension as measured transversely of the spacing between the printed circuit boards. Furthermore, if a wide range of connectors is to be provided to the packaging industry, it becomes necessary to produce the elastomeric body material in a range of several sizes.

In accordance with the principles of the instant invention, a connector for parallel spaced apart printed circuit boards comprises generally an insulating housing of a relatively firm and rigid material which has opposed sides against which the printed circuit boards are clamped. A trough-like recess is provided in each of these opposed sides and elastomeric body means are contained in these recesses. The elastomeric body means has projecting surface portions which normally project beyond the parallel planes defined by the oppositely directed sides and a flexible circuit extends over, and is supported on, the projecting portions of the elastomeric body means. The flexible circuit is wrapped around a side of the body which is between the oppositely directed sides so that the conductors on the flexible circuit extend between the oppositely directed sides. When the connector is clamped between the printed circuit boards, the projecting portions of the elastomeric body means are compressed and the conductors on the flexible circuit are thereby resiliently held against the conductors on the printed circuit boards.

It is accordingly an object of the invention to provide an improved connector having elastomeric contact pressure means. A further object is to provide a connector which can be made in varying sizes which uses standard types of elastomeric bodies. A further object is to provide a connector for printed circuit boards in parallel spaced-apart relationship which is relatively compact rather than massive as compared with the dimensions of the printed circuit boards. A further object is to provide a connector which can be manufactured in a wide range of sizes from a limited number of component parts at a modest tooling expense.

These and other objects of the invention are achieved in preferred embodiments thereof which are briefly described in the foregoing abstract which are described in detail below and which are shown in the accompanying drawing in which:

FIG. 1 is a perspective exploded view showing a connector in accordance with the invention positioned between two parallel printed circuit boards.

FIG. 2 is a cross sectional view of a connector in accordance with the invention.

FIG. 3 is a cross sectional view showing the connector positioned between two parallel circuit boards which are clamped in spaced-apart relationship.

FIG. 4 is a perspective view of a flexible circuit which forms part of the invention.

A connector 2 in accordance with the invention is used to form electrical paths between conductors 4 of the downwardly facing side 6 of a printed circuit board 8 and conductors 10 on the upwardly facing side 12 of a second printed circuit board 14. In accordance with commonly employed packaging techniques, the two boards 8, 14 are held in parallel spaced-apart relationship by any suitable clamping or holding means such as a bolt 16 which extends through the aligned openings 17 in the printed circuit boards and a nut 18 with a suitable spacer between the boards. The connector 2 can serve as the spacer as will be described below.

The connector 2 comprises a connector housing body 20 of suitable firm insulating material, such as a filled nylon, having oppositely directed sides 22, 24 which are opposed to the surfaces 6, 12, and laterally facing sides 23, 25. Trough-like recesses 26, 28 extend into the sides 22, 24 between flat surfaces 30 which are provided on the ends of the housing body. Openings 32 are provided in these end portions of the body for the accommodation of the clamping bolts 16 and upwardly projecting cylindrical bearing bosses 34 around these openings. The bearing bosses are dimensioned to be received in the opening 17 in the printed circuit boards 8, 14 and thus serve to position the connector with reference to the opposed surface 6, 12 of the printed circuit boards.

The electrical connections between the conductors 4 and 10 are provided by parallel spaced-apart conductors 38 on a generally rectangular flexible circuit 36. Opposite edge portions 44, 46 of this flexible circuit are clamped between the adjacent surfaces of elastomeric bodies 40, 42 which are disposed in the recesses 26. As shown clearly in FIG. 2, the elastomeric bodies 40 are generally oval shaped in cross section and the bodies 42 have a circular cross section. The bodies 40 have projecting portions which project beyond the sides of the housing and beyond the planes defined between surfaces 30 at the ends of the housing. The bodies 42 have a circular cross section in this embodiment and lay wholly within the recesses 28. The width of the trough-like recesses 26 is advantageously such that the elastomeric bodies 40, 42 are held in a somewhat compressed condition so that the edge portions 44, 46 of the flexible circuit will be securely held on the housing body.

The flexible circuit 36 has intermediate portions which extend downwardly as viewed in FIG. 2 over the side surface 23 of the housing body and the corners 48 are preferably rounded as shown to avoid any possible damage to the circuit in these areas.

In use, the connector 2 is positioned between the opposed surfaces 6, 12 at the time of assembly with the bearing bosses 34 disposed in the openings 17. The bolts 16 are then passed through the openings 17 and the openings 32 in the housing body and the nuts 18 threaded into the ends of the bolts. The opposed surfaces of the printed circuit boards 8, 14 are drawn against the surfaces 30 of the connector housing so that the elastomeric body members 40 are compressed as shown in FIG. 3. This compression of the bodies 40 produces the contact force which urges the flexible circuit against the conductors 4, 10 and provides conducting paths between corresponding conductors on these surfaces. As shown in FIG. 3, as the bodies 40 are compressed into the recesses 26. The cylindrical elastomeric bodies 42 are also compressed and maintain a pressure on the bodies 40. The stored energy in these elastomeric bodies provides a constant predictable contact force for the electrical contact of the flexible circuit conductors to the conductors on the printed circuit boards.

The elastomeric bodies and the flexible circuits can be manufactured in accordance with the teachings of the above identified U.S. Pat. No. 3,985,413 which teaches the use of a material such as silicone rubber for the body members and a suitable polyimide (Kapton, produced by DuPont deNemours, E.I. & Company) film for the flexible circuit. The conductors on the flexible circuit are preferably produced by etching and are advantageously extremely narrow so that a plurality of conductors on the flexible circuit will extend between each pair of corresponding conductors 4, 10 on the printed circuit board. The spacing of the conductors on the flexible circuit should also be such that the possibility of non-corresponding conductors 4, 10 being electrically connected to each other does not exist.

A significant advantage of the invention is that relatively small elastomeric bodies 40, 42 can be used in connectors of different sizes for different packaging standards in which the spacing between the opposed surfaces of the printed circuit board varies over a relatively wide range. For example, connectors of the type shown in the drawing can have a height, as measured between the opposed sides 22, 24 varying from about 0.25 inches to as much as 1.00 inches or more and relatively small elastomeric bodies 40, 42 can be used in all of these sizes. The oval shaped body 40 can have a height of 0.121 inches and a width of 0.045 inches and the cylindrical body diameter of 0.09 inches for a connector having a height of 0.500 inches or for larger connectors. The width of the connector housing body need not be increased proportionately with the height but can remain constant for connectors of different height. In other words, a connector can be produced in accordance with the principles of the invention for printed circuit boards which have comparatively large spacings therebetween which is not extremely massive. As also mentioned previously, the use of standard size elastomeric bodies 40, 42 in different sizes of housings obviates the requirement of a range of elastomeric body sizes for different packaging dimensions. The relatively simple housing 20 can be produced at a low cost by an injection molding process for the specific requirements of the specific packaging arrangement.

Under some circumstances, it will prove feasible to use a single elastomeric body in each recess 28 rather than the two elastomeric bodies shown in the drawing. In any event, surface portions of the elastomeric body should project beyond the sides of the connector body in order to achieve compression of this body when the connector is clamped between printed circuit boards.

What is claimed is:

1. An electrical connecting device for connecting a first plurality of panel conductors on a first panel-like member to a second plurality of panel conductors on a second panel-like member, said connecting device comprising:

a generally prismatic connector housing body of rigid insulating material, said body having oppositely directed first and second sides and having a third side which is between said first and second sides, each of said first and second sides having a trough-like recess therein, first and second elastomeric body means in said recesses in said first and second sides respectively, each of said elastomeric body means comprising two elastomeric bodies in side-by-side relationship in one of said recesses, each of said elastomeric body means having projecting surface portions which project beyond said first and second sides respectively, a flexible circuit having opposite edge portions, said edge portions being held between said elastomeric bodies in each of said recesses and extending over said projecting surface portions of said elastomeric body means, said flexible circuit having intermediate portions which extend over said third side of said housing body, said flexible circuit having parallel spaced-apart flexible circuit conductors thereon extending between said opposite edge portions whereby, upon mounting said panel-like members in parallel spaced-apart relationship with said first conductors opposed to said second conductors and with said connecting device between said panel-like members, said projecting portions of said elastomeric body means will be compressed towards said first and second surfaces, and said flexible circuit conductors will be urged against said panel conductors and said first panel conductors will be elctrically connected to said second panel conductors.

2. A connecting device as set forth in claim 1, one of said bodies in each of said trough-like recesses having a generally oval-shaped cross section, said projecting portions being on said one body.

3. In combination with a pair of panel-like members disposed in parallel spaced-apart relationship having conductors on their opposed surfaces, an electrical connecting device serving to electrically connect said conductors on one of said panel-like members to said conductors on the other panel-like member;

said connecting device comprise a prismatic connector housing body of rigid insulating material, said body having oppositely directed first and second sides and having a third side which is between said first and second sides, each of said first and second sides having a trough-like recess therein, said opposed surfaces being clamped against said first and second sides, first and second elastomeric body means in said recess in said first and second sides, each of said elastomeric body means comprising two elastomeric bodies in side-by-side relationship, each of said elastomeric body means having normally projecting surface portions which normally project beyond said first and second sides respectively, said normally projecting surface portions being compressed by said opposed surfaces of said panel-like members, a flexible circuit having opposite edge portions, said edge portions held between said elastomeric bodies in each of said recesses and extending between compressed portions of said first and second elastomeric body means and said surfaces of said panel-like members, said flexible circuit having intermediate portions which extend over said third side of said housing body, said flexible circuit having parallel spaced-apart flexible circuit conductors thereon extending between said opposite edge portions whereby, said flexible circuit conductors are urged against said conductors on said opposed surfaces by said compressed portions of said elastomeric body means thereby to electrically connect corresponding conductors on said opposed surfaces to each other.

4. A combination set forth in claim 3 wherein one of said bodies in each of said trough-like recesses has a generally oval-shaped cross section, said normally projecting being on said one body.

5. The combination set forth in claim 4 wherein the other one of said bodies in each of said trough-like recesses has a circular cross section, said one body and said other body in each of said recesses being compressed thereby to provide stored energy which serves to maintain said flexible circuit conductors against said conductors on said opposed surfaces.

* * * * *